US010813224B2

(12) United States Patent
Benwadih et al.

(10) Patent No.: US 10,813,224 B2
(45) Date of Patent: Oct. 20, 2020

(54) DEVICE WITH ELECTRICALLY CONDUCTING TRACK AND METHOD FOR FABRICATING THE DEVICE (71) Applicant: Commissariat a l'energie atomique et aux energies alternatives, Paris (FR)

(72) Inventors: Mohammed Benwadih, Champagny sur Marne (FR); Abdelkader Aliane, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 15/618,835

(22) Filed: Jun. 9, 2017

(65) Prior Publication Data
US 2017/0359902 A1 Dec. 14, 2017

(30) Foreign Application Priority Data
Jun. 10, 2016 (FR) ..................... 16 55337

(51) Int. Cl.
| H05K 3/00 | (2006.01) |
|---|---|
| B05D 1/02 | (2006.01) |
| H05K 3/12 | (2006.01) |
| C09D 11/52 | (2014.01) |
| C09D 11/037 | (2014.01) |
| B81B 7/00 | (2006.01) |
| C09D 11/322 | (2014.01) |
| C09D 11/36 | (2014.01) |
| H01Q 7/00 | (2006.01) |
| C09D 11/033 | (2014.01) |
| H05K 1/09 | (2006.01) |
| H05K 1/02 | (2006.01) |
| H01Q 1/38 | (2006.01) |
| H05K 1/16 | (2006.01) |

(52) U.S. Cl.
CPC ............... *H05K 3/125* (2013.01); *B05D 1/02* (2013.01); *B81B 7/0006* (2013.01); *C09D 11/033* (2013.01); *C09D 11/037* (2013.01); *C09D 11/322* (2013.01); *C09D 11/36* (2013.01); *C09D 11/52* (2013.01); *H01Q 7/00* (2013.01); *H05K 3/0014* (2013.01); *B81B 2207/07* (2013.01); *H01Q 1/38* (2013.01); *H05K 1/0284* (2013.01); *H05K 1/092* (2013.01); *H05K 1/097* (2013.01); *H05K 1/165* (2013.01); *H05K 2201/032* (2013.01); *H05K 2201/10098* (2013.01); *H05K 2203/013* (2013.01)

(58) Field of Classification Search
CPC . B05D 1/02; H01Q 1/38; H05K 1/165; H05K 2201/032; H05K 2203/013; H05K 3/125; C09D 11/52
USPC ................................................. 427/123, 125
See application file for complete search history.

(56) References Cited

U.S. PATENT DOCUMENTS

| 5,659,153 | A | 8/1997 | Narayan |
|---|---|---|---|
| 6,986,877 | B2 | 1/2006 | Takikawa |
| 8,178,203 | B2 | 5/2012 | Hata |
| 9,305,711 | B2 | 4/2016 | Fujita |
| 9,425,501 | B2 | 8/2016 | Desclos |
| 9,528,667 | B1 | 12/2016 | Pereyra |
| 10,038,113 | B1 | 7/2018 | Nelson |
| 10,189,971 | B2 | 1/2019 | Lima |
| 10,350,830 | B2 | 7/2019 | Bailly et al. |
| 2004/0155029 | A1 | 8/2004 | Haag |
| 2005/0191520 | A1 | 9/2005 | Guntermann |
| 2007/0221404 | A1 | 9/2007 | Das et al. |
| 2008/0086876 | A1 | 4/2008 | Douglas |
| 2008/0251768 | A1 | 10/2008 | Hsu |
| 2009/0186169 | A1 | 7/2009 | Shacklette |
| 2009/0229108 | A1 | 9/2009 | Shamblin |
| 2009/0274834 | A1 | 11/2009 | Chopra et al. |
| 2009/0294739 | A1 | 12/2009 | Lee et al. |
| 2010/0000441 | A1 | 1/2010 | Jang |
| 2011/0042813 | A1 | 2/2011 | Crain |
| 2011/0215279 | A1* | 9/2011 | Zinn ................ H01B 1/22 252/513 |
| 2012/0017437 | A1 | 1/2012 | Das et al. |
| 2012/0199393 | A1* | 8/2012 | Yoshikawa ........ B23K 35/007 174/94 R |
| 2012/0235879 | A1 | 9/2012 | Eder et al. |
| 2012/0251736 | A1 | 10/2012 | Hong |
| 2012/0286218 | A1* | 11/2012 | Mei .................. C09D 11/52 252/512 |
| 2013/0033827 | A1 | 2/2013 | Das et al. |

(Continued)

FOREIGN PATENT DOCUMENTS

| EP | 2 114 114 A1 | 11/2009 | |
|---|---|---|---|
| WO | WO 2010/123733 A1 | 10/2010 | |
| WO | WO 2016/060838 A1 | 4/2016 | |
| WO | WO-2016060838 A1 * | 4/2016 | ............. C09D 11/52 |

OTHER PUBLICATIONS

Agina, Elena V., Alexey S. Sizov . . . Sergei A. Ponomarenko. "Polymer Surface Engineering for Efficient Printing of Highly Conductive Metal Nanoparticle Inks." ACS Applied Materials & Interfaces 7, No. 22 (2015): 11755-1764 (Year: 2015).*

(Continued)

*Primary Examiner* — Jose I Hernandez-Kenney
(74) *Attorney, Agent, or Firm* — Oblon, McClelland, Maier & Neustadt, L.L.P.

(57) ABSTRACT

A device including an electrically conducting track arranged on a support includes a step of supply of the support, and a step of formation of the electrically conducting track on the support including a step of supply of a solution intended to be deposited on the support, a step of deposition of the solution by printing on the support. The step of supply of the solution is such that the solution supplied includes a mixture of a solvent, of a set of metal particles and of a metallic material having a melting point below that of the metal particles of the set of metal particles, and the method includes a step of melting of the metallic material which results in the formation of a solder of metallic material between metal particles of the set of metal particles.

9 Claims, 3 Drawing Sheets

(56) References Cited

U.S. PATENT DOCUMENTS

| | | |
|---|---|---|
| 2014/0004371 A1 | 1/2014 | Chung |
| 2014/0151607 A1 | 6/2014 | Lowenthal |
| 2015/0138024 A1* | 5/2015 | Kalistaja ............... H01Q 1/36 343/702 |
| 2015/0257278 A1 | 9/2015 | Niskala |
| 2015/0337145 A1 | 11/2015 | Torrisi |
| 2016/0012936 A1 | 1/2016 | Wu |
| 2016/0086686 A1 | 3/2016 | Dorfman |
| 2016/0113118 A1 | 4/2016 | Pereyra |
| 2016/0295702 A1 | 10/2016 | Heikkinen |
| 2016/0309595 A1 | 10/2016 | Heikkinen |
| 2016/0311705 A1 | 10/2016 | Cok |
| 2016/0316570 A1 | 10/2016 | De Vaan |
| 2017/0135198 A1 | 5/2017 | Keranen |
| 2017/0226303 A1 | 8/2017 | Feng |
| 2017/0298242 A1 | 10/2017 | Mostowy-Gallagher |
| 2018/0114703 A1 | 4/2018 | Karni |
| 2018/0149321 A1 | 5/2018 | Torvinen |
| 2018/0279471 A1 | 9/2018 | Chen |
| 2018/0348900 A1 | 12/2018 | Heinrich |

OTHER PUBLICATIONS

French Preliminary Search Report dated Feb. 21, 2017 in French Application 16 55337 filed on Jun. 10, 2016 (with English Translation of Categories of Cited Documents and Written Opinion).

Zhigang Wu et al: "Hemispherical coil electrically small antenna made by stretchable conductors printing and plastic thermoforming", Journal of Micromechanics & Microengineering, vol. 25, No. 2., Jan. 22, 2015, pp. 5.

Kamil Janeczek et al., "Investigation of RFID tag Antennas printed on flexible substrates using two types of conductive pastes," IEEE Electronic System-Integration Technology Conference (ESTC), Sep. 2010, pp. 5.

A. Ciccomancini Scogna et al. "Performance analysis of stripline surface roughness models", International Symposium on Electromagnetic Compatibility—EMC Europe, 2008, pp. 6.

Office Action issued in U.S. Appl. No. 15/869,169 dated Mar. 19, 2019, 15 pages.

French Preliminary Search Report dated Feb. 10, 2017 in Patent Application No. FR 1655337 (with English translation of categories of cited documents), 3 pages.

French Preliminary Search Report dated Sep. 29, 2017 in French Application 17 50269 filed on Jan. 12, 2017 (with English Translation of Categories of Cited Documents and Written Opinion).

U.S. Office Action dated Jan. 31, 2020 in U.S. Appl. No. 15/869,169, 11 pages.

U.S. Office Action dated Jul. 30, 2019 in U.S. Appl. No. 15/869,169, 13 pages.

U.S. Office Action dated Mar. 19, 2019 in U.S. Appl. No. 15/869,169, 15 pages.

* cited by examiner

DEVICE WITH ELECTRICALLY CONDUCTING TRACK AND METHOD FOR FABRICATING THE DEVICE

FIELD OF THE INVENTION

The field of the invention relates to electrically conducting tracks, notably obtained by printing, in particular in order to form an antenna or an inductance.

PRIOR ART

In the field of electronics, forming electrically conducting tracks that can at least partly delimit an antenna or an inductance is known. The deposition techniques in microelectronics are suitable but expensive, and are limited to rigid supports. There is therefore a need to lower the costs of the operations for forming electrically conducting tracks, and allow such tracks to be formed on flexible supports if required.

In order to lower costs, solutions have been developed for printing ink-based electrically conducting tracks. Besides the advantage of lower costs, such inks may also be subjected to stresses after they have dried, making deposition on flexible substrates possible.

The document "Investigation of RFID tag Antennas printed on flexible substrates using two types of conductive pastes" by Kamil Janeczek et al., published in IEEE "Electronic System-Integration Technology Conference (ESTC)", 2010 3rd—conference of 13-16 Sep. 2010, which was held in Berlin, proposes the use of a paste comprising silver mixed with a polymer. The polymer allows some flexibility, but has the drawback of degrading the electrical conductivity and creating parasitic capacitances. The result is the formation of antennas of medium quality. In fact, a quality factor of the antenna is dependent on its electrical conductivity.

In general, inks intended to be deposited by printing and comprising silver and a polymer are not without drawbacks. In fact, the polymer acts as a dielectric, and the concentration of the field lines under the dielectric leads to a drop in efficiency and gain. Accordingly, this technique is only used when the intended application requires a reduced bandwidth and low gain. Moreover, such ink has a considerable roughness. It is known that the ohmic losses on electrical conductors are related to their electrical conductivity, but also to the roughness of the latter, as explained in the document of A. C. Scogna and M. Schauer, "Performance analysis of stripline surface roughness models", published in 2008 in International Symposium on Electromagnetic Compatibility—EMC Europe, 2008, pp. 1-6.

There is therefore a need to find an alternative to the prior art, and preferably this alternative may make it possible to improve the conductivity of an electrically conducting track, notably when the latter is deposited by printing.

Aim of the Invention

The invention has the aim of at least partly meeting the needs mentioned above.

This aim is approached with a method for fabricating a device comprising an electrically conducting track arranged on a support, said method comprising a step of supplying the support, and a step of forming the electrically conducting track on the support comprising the following steps: a step of supplying a solution intended to be deposited on the support, a step of depositing the solution by printing on the support. The step of supplying the solution is such that said solution that is supplied comprises a mixture of a solvent, a set of metal particles and a metallic material having a melting point below that of the metal particles of the set of metal particles, and the method comprises a step of melting the metallic material which results in the formation of a solder of metallic material between the metal particles of the set of metal particles.

In particular, the step of forming the electrically conducting track on the support comprises a step of heat treatment of the solution deposited on the support which results in evaporation of the solvent.

Notably, the heat treatment step comprises: a first phase in which the support and the solution deposited are subjected to a first temperature comprised between 40° C. and 80° C., notably equal to 60° C., for a first time comprised between 1 second and 360 seconds, notably equal to 300 seconds, then a second phase in which the support and the solution deposited are subjected to a second temperature comprised between 80° C. and 120° C., notably equal to 100° C., for a second time comprised between 1 second and 500 seconds, notably equal to 300 seconds, and then a third phase in which the support and the solution deposited are subjected to a third temperature comprised between 100° C. and 300° C., notably equal to 140° C., for a third time comprised between 1 second and 3600 seconds, notably equal to 1800 seconds.

In particular, it results in implementation of the heat treatment step melting of the metallic material.

According to one embodiment, at least one part of the support is capable of being thermoformed, and after the step of forming the electrically conducting track on the support, the method comprises a step of thermoforming said at least one part of the support.

In particular, the thermoforming step causes melting of the metallic material, and after the thermoforming step, some or all of the metal particles of the set of metal particles are soldered together by said metallic material.

Notably, the step of depositing the solution on the support is such that a pattern is produced that is intended to delimit at least one part of an antenna or inductance.

Preferably, the metallic material is selected from the following alloys: Ag—Bi, Ag—Sn—Bi, Ag—Sn—Cu, Au—Sn.

The method may comprise a step of forming the support to be supplied, comprising a step of supplying a base and a step of forming a hanging layer intended to form an interface between the electrically conducting track and the base.

The invention also relates to a device comprising a support and an electrically conducting track arranged on the support, said electrically conducting track comprising a set of metal particles, metal particles of the set of metal particles being joined together electrically by soldering of a metallic material of said track, said metallic material having a melting point below that of said metal particles of the set of metal particles.

Notably, at least one part of the support is formed in a material capable of being thermoformed.

The metallic material may be selected from the following alloys: Ag—Bi, Ag—Sn—Bi, Ag—Sn—Cu, Au—Sn.

The metal particles preferably have maximum external dimensions comprised between 30 nm and 30 µm, and preferably comprised between 1 µm and 10 µm.

Notably, the support takes a shape obtained by thermoforming, said electrically conducting track taking on said shape of the support obtained by thermoforming.

The electrically conducting track may form at least one part of an antenna or at least one part of an inductance.

For example, the support comprises a base and a hanging layer arranged on the base and ensuring that the electrically conducting track is held on said support.

BRIEF DESCRIPTION OF THE FIGURES

The invention will be better understood on reading the following description, given only as a nonlimiting example, and referring to the drawings, where.

In these figures, the same references are used for denoting the same elements.

Moreover, the elements shown in the figures are not to scale.

DESCRIPTION OF PARTICULAR EMBODIMENTS

The method and the device described below propose the formation, by printing, of an electrically conducting track comprising metal particles as well as a metallic material, notably an alloy, preferably used for soldering the metal particles together. As a result, an electrically conducting track is obtained that has characteristics, notably of electrical conductivity, that are improved relative to the prior art using simple metal particles put in contact by a polymer. In particular, the metallic material is preferably selected to have a melting point (also called melting temperature) comprised within a temperature range applied for evaporating the solvent contained in the ink—also called solution hereinafter—used during printing of the electrically conducting track, or during thermoforming of the support on which the electrically conducting track is formed.

In the present description, an alloy is a combination of metals. From the standpoint of its melting point, an alloy may melt at a temperature lower than that of the least fusible of its constituents. The temperature of the eutectic of the alloy may give its melting point. For some alloys, their melting point may be even lower than that of the most fusible of the metals making up said alloy (this is true for example for the alloy Ag—Bi, which melts at 138° C., whereas the melting point of Bi is equal to 271° C. and the melting point of Ag is equal to 960° C.). It is generally mercury, tin and bismuth that may impart fusibility to the alloy. An alloy generally has a precise composition of its constituents that is called "eutectic", so as to obtain the lowest possible melting point for the alloy.

Figure 1:
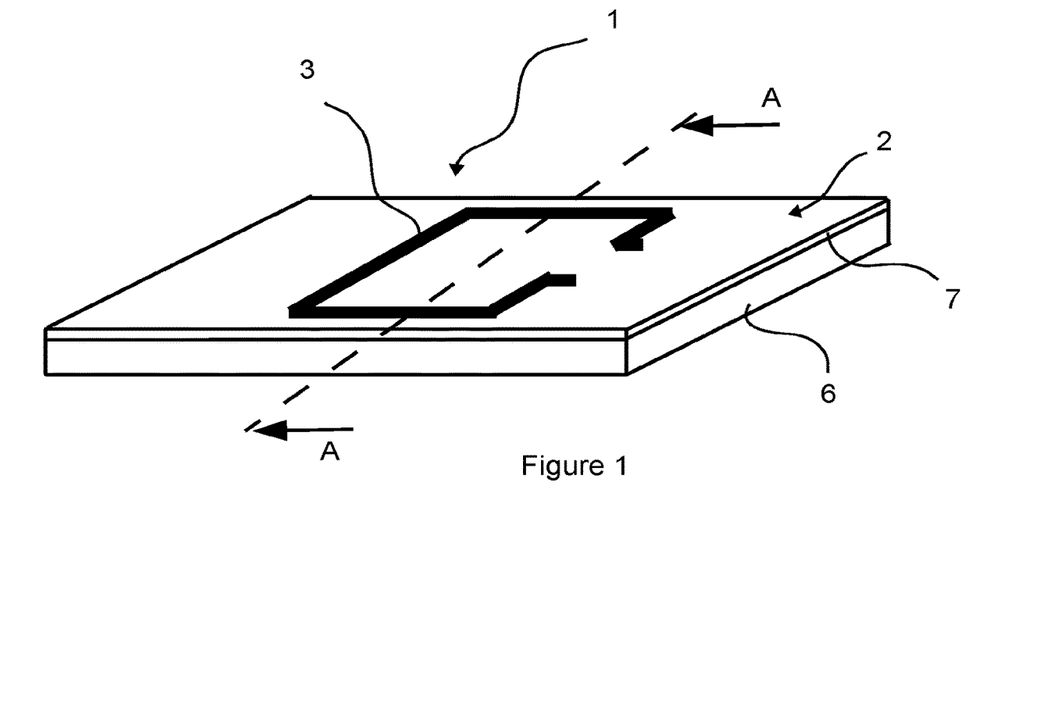
FIG. 1 illustrates a device provided with an electrically conducting track according to one embodiment of the invention.
Figure 2:
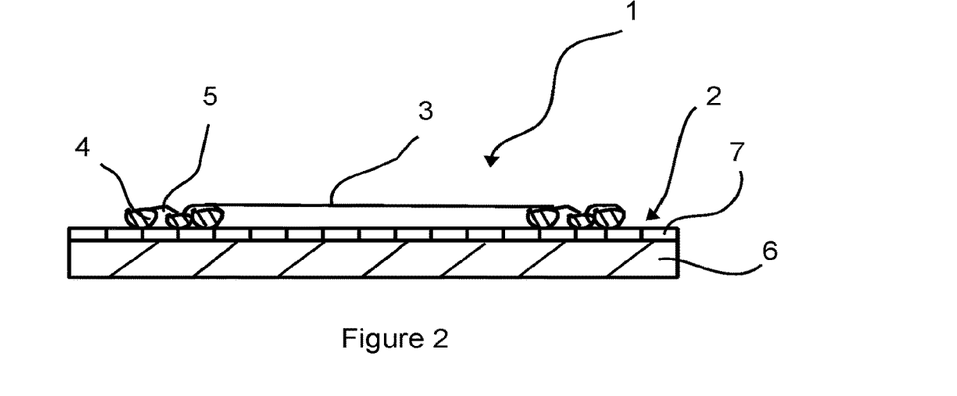
FIG. 2 shows FIG. 1 according to section A-A.

FIGS. 1 and 2 illustrate a device 1 comprising a support 2 and an electrically conducting track 3 arranged on the support 2 (notably this electrically conducting track 3 is in contact with the support 2). The electrically conducting track 3 comprises (FIG. 2) a set of metal particles 4. Metal particles 4 of the set of metal particles 4 are joined together electrically by soldering of a metallic material 5 of the electrically conducting track 3. This metallic material 5 has a melting point below that of the metal particles 4 of the set of metal particles 4. "Metal particles 4 of the set of particles joined together electrically by soldering of metallic material" means that the metallic material 5 can provide electrical continuity between some or all of the metal particles 4, in contrast to the polymer of the prior art. Preferably, the electrical connection is such that it is said that some or all of the metal particles 4 are soldered together by the metallic material 5 having a melting point below the melting point of the metal particles. In other words, it has been possible to obtain the electrically conducting track 3 by melting of the metallic material 5 without melting the metal particles 4.

In the present description, melting point means the temperature at normal atmospheric pressure at which the associated element melts when it is subjected to said melting point.

The electrically conducting track 3 may form at least one part of an antenna or at least one part of an inductance.

Depending on the applications, support 2 may be formed wholly or partly by polycarbonate (PC), PC-ABS, polyethylene, ceramic, passivated steel, glass, an oxide, $SiO_2$, etc.

The fact that the metallic material 5 has a melting point below that of the metal particles 4 offers advantages in regard to the design of the device 1, notably based on liquid phase printing, and may allow thermoforming of the support 2 while maintaining good electrical conduction of the electrically conducting track 3 after thermoforming, notably when the latter is carried out at a temperature making it possible to melt said metallic material 5, but notably not the metal particles 4.

The metal particles 4 of the set of metal particles may be of silver, gold, copper, nickel, palladium, or platinum. Silver is preferred for its good electrical conductivity and because its native oxide is an electrical conductor. In general, the metal particles 4 of the set of metal particles may have maximum external dimensions comprised between 30 nm and 30 μm, and preferably comprised between 1 μm and 10 μm. These maximum external dimensions are notably such that they allow printing of the electrically conducting tracks 3: in this case the metal particles 4 must for example be able to pass through the nozzles for ink jet printing. The metal particles 4 may have a high Young's modulus. Here, as the particles are metallic, they effectively have a high Young's modulus and consequently they do not easily deform, especially at the temperatures used in the context of the method described hereunder, hence the advantage of the fusible alloy (i.e. the metallic material) which softens near its melting point and therefore perfectly receives the mechanical stresses owing to decrease in its Young's modulus when it becomes soft.

In particular, in the context of the track 3, the set of metal particles 4 may be such that each metal particle 4 is soldered by the metallic material 5 to at least one other metal particle 4 of the set of metal particles. Advantageously, the metallic material 5 is such that it solders all the metal particles 4 of the set of metal particles by coating.

The metallic material 5 may be indium, which has a melting point of 156° C., or else bismuth, tin, lead, etc. The metallic material 5 is preferably a metal alloy. The metallic material 5 is preferably selected from the following alloys: Ag—Bi (alloy of silver and bismuth), Ag—Sn—Bi (alloy of silver, tin, and bismuth), Ag—Sn—Cu (alloy of silver, tin, and copper), Au—Sn (alloy of gold and tin). The following may also be used as the metallic material: an alloy of tin and lead, an alloy of lead, tin and silver, an alloy of tin, lead and antimony, an alloy of tin, lead and silver, an alloy of tin, lead and cadmium, an alloy of bismuth, tin, lead and cadmium, an alloy of bismuth, lead and tin. The alloy may also be selected from:

- gold at 82% and silicon at 12%,
- an amalgam,
- an alloy of 236 parts lead, 207 parts tin, 420 parts bismuth, also called pink alloy, with a melting point below 100° C.,
- an alloy of 3 parts lead, 2 parts tin, 5 parts bismuth, with a melting point of 91.6° C.,
- an alloy of 1 part lead, 1 part tin, 2 parts bismuth, with a melting point of 93° C.,
- an alloy of 8 parts bismuth, 5 parts lead, 3 parts tin, which melts in boiling water,
- an alloy of 1 part tin, 1 part lead, 2 parts bismuth, with a melting point of 94° C.,
- an alloy of 5 parts lead, 3 parts tin, 8 parts bismuth, with a melting point of 84.5° C.,
- an alloy of 17 parts tin, 33 parts lead, 50 parts bismuth, which melts at 94° C.,
- an alloy of 2 parts lead, 2 parts tin, 7 to 8 parts bismuth, 1 to 2 parts cadmium, with a melting point of between 66° C. and 71° C.,
- an alloy of 15.5 parts tin, 30 parts lead, 40 parts bismuth, 15.5 parts cadmium, with a melting point of 71° C.,
- an alloy of 13% tin, 27% lead, 50% bismuth, 10% cadmium, with a melting point of 70° C.,
- an alloy of 80 parts bismuth, 50 parts lead, 30 parts tin, 16 parts mercury, with a melting point of the order 65° C.,
- an alloy of 8 parts lead, 4 parts tin, 15 parts bismuth, 3 parts cadmium, which melts fully above 60° C. but softens between 55° C. and 60° C.,
- an alloy of 50 parts bismuth, 12.5 parts tin, 12.5 parts cadmium, 25 parts lead, with a melting point of 47° C.,
- an alloy of 50% tin, 32% lead, 18% cadmium, with a melting point of 145° C.,
- an alloy of 62% tin, 36% lead, 2% silver, with a melting point of 178° C.,
- an alloy of 63% tin, 37% lead, with a melting point of 183° C.,
- an alloy of 63% tin, 36.7% lead and 0.3% antimony, with a melting point of 183° C.,
- an alloy of 60% tin, 39.7% lead and 0.3% antimony, with a melting point of 188° C.,
- an alloy of 20% tin and 80% gold, with a melting point of 280° C.,
- an alloy of 93.5% lead, 5% tin, 1.5% silver, with a melting point of 301° C.,
- an alloy represented by the formula $Sn_5Pb$, with a melting point of 194° C.,
- an alloy represented by the formula $Sn_4Pb$, with a melting point of 189° C.,
- an alloy represented by the formula $Sn_3Pb$, with a melting point of 186° C.,
- an alloy represented by the formula $Sn_2Pb$, with a melting point of 196° C.,
- an alloy represented by the formula $SnPb$, with a melting point of 241° C.,
- an alloy represented by the formula $Sn_5Pb_3$, with a melting point of 289° C.,
- a Darcet alloy $Bi_{50}Pb_{25}Sn_{25}$, with a melting point of 94° C.,
- a Newton alloy $Bi_{50}Pb_{31}Sn_{19}$, with a melting point of 94° C.,
- $Sn_{43}Pb_{43}Bi_{14}$ or $Sn_{42}Bi_{58}$ with eutectics melting between 138° C. and 163° C.,
- The Bi—Pb binary eutectic alloys with content of Bi between 55% and 58%, with a melting point between 124° C. and 125° C.,
- An alloy belonging to the family of Au—Sn eutectics in various proportions (for example 20% gold and 80% tin), having a melting point below 200° C.,
- The Ag—Bi alloys, or others of this family,
- One of the following alloys Sn—Ag—Cu, Sn—Pb or Sn—Pb—Ag In the present description, part or percentage means part by weight or percentage by weight relative to a total weight, here notably of the alloy (and therefore of the metallic material).

The alloys listed above are all compatible with the use of silver particles; the solvent used in the context of the solution will be selected so as to avoid being too corrosive/aggressive with respect to the alloy and the support (notably when said support is made of polycarbonate). The solvent intended to be used here is preferably anhydrous (i.e. water-free), and is preferably an acid or is strongly reducing.

Regarding the alloy, when the latter comprises at least one of the following constituents: tin, silver, copper or bismuth, excellent results are obtained.

According to a particular embodiment example, the metal particles are particles of silver and the metallic material is $Sn_{96.5}Ag_3Cu_{0.5}$, this last-mentioned material has a melting point of 217° C. and a Young's modulus of 41.6 GPa.

Figure 3:
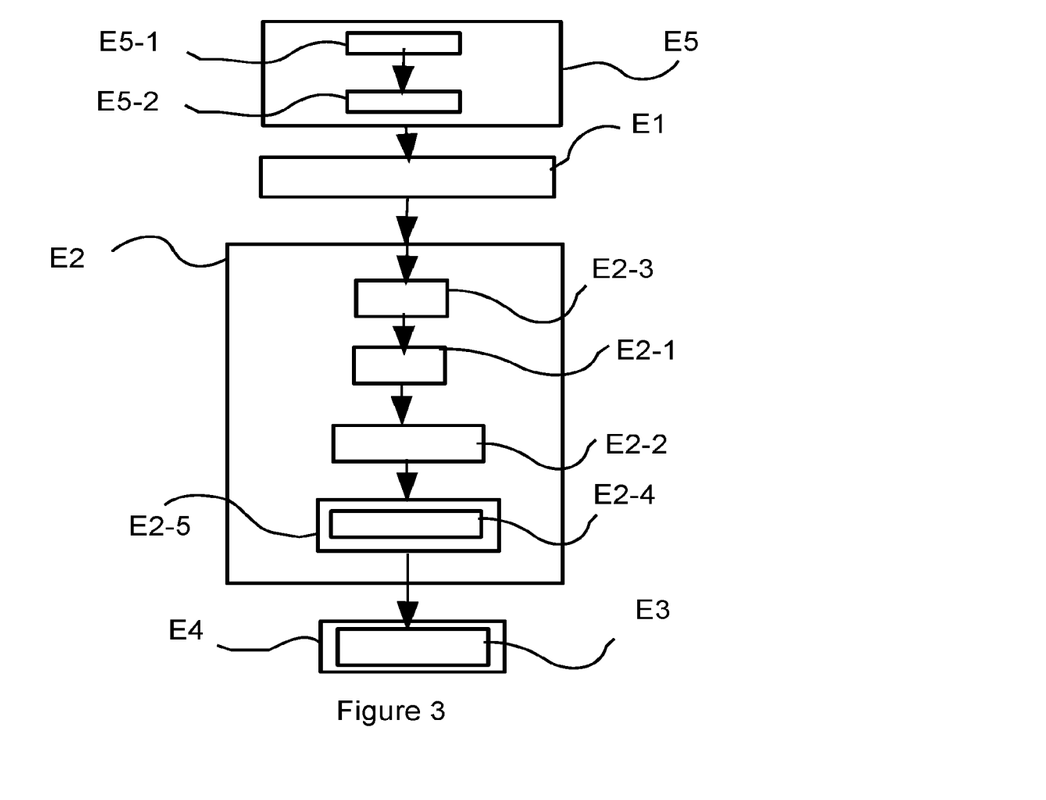
FIG. 3 illustrates steps implementing a method according to a particular embodiment of the invention.

It will be understood from the foregoing that the invention also relates to a method for fabricating a device 1 comprising the electrically conducting track 3 arranged on the support 2. As illustrated in FIG. 3, this method comprises a step of supply E1 of the support 2 and a step of formation E2 of the electrically conducting track 3 on the support 2. This step of formation E2 comprises the following steps: a step of supply E2-1 of a solution intended to be deposited on the support 2 and a step of deposition E2-2 of the solution by printing, notably by screen printing, by ink jet printing, by gravure printing or by coating, on the support 2. Preferably, the step of deposition E2-2 of the solution on the support 2 is such that a pattern is produced that is intended to delimit at least one part of an antenna or inductance. The step of supply E2-1 of the solution is notably such that the solution supplied comprises a mixture of a solvent, of the set of metal particles 4 and of the metallic material 5 having a melting point below that of the metal particles 4 of the set of metal particles. In the present description, the solution is liquid (owing to deposition by printing) and may thus be likened to an ink.

The method (notably step E2) may comprise a step of preparation E2-3 of the solution to be supplied comprising formation of the mixture comprising the solvent, the metal particles 4 of the set of metal particles and the metallic material 5. Notably, the mixture may consist of putting the solvent, the metal particles 4 and powder of the metallic material 5 or else the solvent, the metal particles 4 and a soldering paste comprising the metallic material 5 into a vessel. In other words, the metallic material 5 incorporated in the solution may be in the form of a powder of a metal alloy before being mixed with said solution, or said metallic material 5 is present in a soldering paste added to said solution. The role of the solvent is to wet and fluidify the mixture to obtain a solution that can be deposited by printing, for example by ink jet printing or by screen printing. Ideally, the solvent has a very low vapor pressure at room temperature, to minimize drying on the support 2, but allowing it to evaporate in a reasonable time notably at a temperature of the order of 150° C. Therefore substances with a high evaporation point such as ethylene glycol or some other alcohol are used as solvent. The metallic material 5, also called fusible binder, is selected to guarantee cohesion of the layer forming the electrically conducting track 3 in the dry state, after evaporation of the solvent. In the wet state, notably when it is in the form of soldering paste, the metallic material 5 is dispersed in the solvent and increases its viscosity, and may affect the rheology of the paste, which we want to be thixotropic (lower viscosity at high shearing). Moreover, the mixture may also comprise dispersants that prevent agglomeration or sedimentation of the metallic material 5 in the form of powder or of soldering paste. The aforementioned dispersants may be surfactants such as terpineol or Surfynol®.

In order to improve the electrical conductivity of the electrically conducting track 3, the method comprises (FIG. 3) a step of melting (also called step of fusion) E2-4, E3 of the metallic material 5 which results in the formation of a solder of metallic material 5 between the metal particles 4 of the set of metal particles. Of course, this step of melting E2-4, E3 may be implemented after deposition of the solution on the support 2. As will be seen later, a first step of melting E2-4 may be implemented, notably concomitantly with evaporation of the solvent, and/or a second step of melting E3 concomitantly with a step of thermoforming the support 2. Moreover, it will be understood that at the end of the step of forming the track 3 or more generally at the end of the method for fabricating the device, the track 3 preferably comprises metal particles soldered together by the metallic material 5, this soldering resulting from the step of melting.

According to one embodiment, the step of formation E2 of the electrically conducting track 3 on the support 2 comprises a step of heat treatment E2-5 of the solution deposited on the support 2 which results in evaporation of the solvent. In this sense, at the end of evaporation of the solvent it is possible to obtain the electrically conducting track 3, and preferably whose metal particles 4 are soldered together by the metallic material 5 thus ensuring good electrical conductivity of the electrically conducting track 3. It will be understood that a person skilled in the art will be able to select the mixture so that it is suitable for said step of heat treatment. Moreover, it will also be understood that implementation of the heat treatment step E2-5 preferably results in melting of the metallic material: it is then said that the heat treatment step implements said step of melting E2-4 of the metallic material.

Preferably, the step of preparing the solution—and therefore solution supplied—is such that for the mass formed by the metal particles 4 of the set of metal particles and the metallic material 5, said metallic material represents between 1 wt % and 25 wt % of the mass, and preferably between 1 wt % and 10 wt % of the mass, said metal particles 4 constituting the remainder. With increasing percentage by weight of the metallic material 5, we increasingly found coating of the metal particles 4 following the step of melting E2-4, E3 and notably in the example mentioned above based on particles of silver and $Sn_{96.5}Ag_3Cu_{0.5}$. When metal particles 4 of silver were used with the metallic material 5 formed by $Sn_{96.5}Ag_3Cu_{0.5}$, it was found that at between 5% and 10% of the metallic material 5 within the mass, solders were produced between metal particles 4 according to a first state in which the metal particles 4 are not completely covered with the metallic material 5 and that when the percentage rose above 10%, solders were produced according to a second state, coating the silver particles together. It will be understood that the more we increase the amount of metallic material 5, the more the solders obtained by the melting of the latter will fill the spaces between the metal particles 4 until all are coated in a layer of metallic material 5 if the amount of said metallic material allows. In other words, the composition of the solution may be selected so that the corresponding step of melting of the metallic material is such that at the end of it, and after solidification of the metallic material, soldering takes place, coating the metal particles or leaving surfaces of metal particles not covered with metallic material. The choice of soldering depends on the electrical conductivity of the metal particles, in fact the largest area is preferred for the element that gives the best electrical conductivity for the whole: if the metal particles are more electrically conductive than the metallic material, soldering will preferably be carried out such that it leaves surfaces of metal particles not covered with metallic material, and vice versa if the metallic material is more electrically conductive than the metal particles, soldering will preferably be performed such that the metallic material 5 coats the metal particles 4 completely after soldering.

Figure 4:
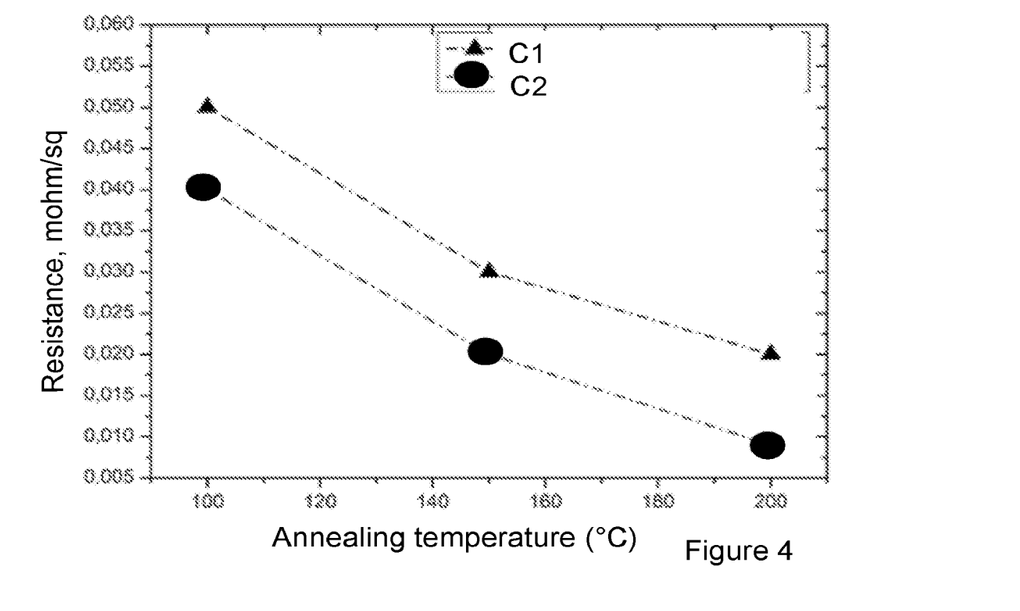
FIG. 4 illustrates the electrical resistance of the electrically conducting track obtained by printing and comprising on the one hand only particles of silver, and on the other hand particles of silver and a metallic material as a function of temperature.

FIG. 4 shows the electrical resistance in mohm/sq or mohm/square as a function of the temperature (called annealing temperature) linked to the step of heat treatment applied for 30 minutes to evaporate the solvent for an ink comprising only silver particles (Curve C1), and for an ink comprising silver particles mixed with the metallic material (Curve C2). In the context of FIG. 4, the metal particles are of silver with a size of about 400 nm to 1 μm and represent 90 wt % of the mass formed by the silver particles and the metallic material. Moreover, in this case the metal particles are mixed to 10 wt % of said mass with a fusible alloy of the Ag—Sn—Cu type. The solution is deposited by screen printing, and the temperature then applied varies between 100 and 200° C. The thickness of the metallization obtained (i.e. the electrically conducting track) is about 10 μm.

In the case of the ink alone (curve C1), after evaporation of the solvent, the particles touch one another, thus producing point electrical contacts between them. In the case of the ink comprising silver particles 4 mixed with the metallic material 5 (curve C2), the metallic material 5 comes to solder the particles 4 together at the end of the evaporation of the solvent, thus performing a corresponding step of melting. It can be seen, on reading FIG. 4, that use of the mixture according to the present invention makes it possible to obtain better results than with silver particles alone.

Moreover, it was put at the forefront during the heat treatment step E2-5 that application of a protocol using several different temperature levels allowed even better electrical conductivity to be obtained. According to this protocol, the step of heat treatment E2-5 comprises a first phase in which the support 2 and the solution deposited are subjected to a first temperature comprised between 40° C. and 80° C., notably equal to 60° C., for a first time comprised between 1 second and 360 seconds, notably equal to 300 seconds. This first phase notably makes it possible to avoid rising too quickly to the boiling point of certain solvents and avoid creating craters or holes in the layer that we aim to form (i.e. the track) on sudden evaporation of the solvent. The first phase makes it possible to evaporate one or more alcohols that may be present in the solvent of the solution, the alcohol or alcohols that evaporate during the first phase may be selected from ethanol, isopropanol, it is possible that the solution may also contain acetone, used as solvent, to be evaporated during the first phase. The step of heat treatment E2-5 comprises, after the first phase, a second phase in which the support 2 and the solution deposited are subjected to a second temperature comprised between 80° C. and 120° C., notably equal to 100° C., for a second time comprised between 1 second and 500 seconds, notably equal to 300 seconds. This second phase makes it possible to congeal a homogeneous composition notably between the mixture of Ag (metal particles) and the solder (metallic material). Moreover, this second phase makes it possible to evaporate part of the solvent having a higher boiling point, for example above 100° C., this part of the solvent may then comprise for example cyclopentanone, and/or butyrolactone, and/or toluene. Notably, this second phase does not degrade the appearance of the metal particles. Finally, the step of heat treatment E2-5 comprises, after the second phase, a third phase in which the support and the solution deposited are subjected to a third temperature comprised between 100° C. and 300° C., notably equal to 140° C., for a third time comprised between 1 second and 3600 seconds, notably equal to 1800 seconds. This third phase notably allows evaporation of the solvent residues and organic residues and if applicable melting of the metallic material 5 (i.e. there is implementation of a step of melting E2-4) which must therefore be selected appropriately. Thus, the third phase may allow the metal particles to be connected together. This protocol is functional with most of the materials that will be selected as a function of the temperatures involved, only the substrate is limiting, for example polycarbonate is only stable up to a maximum of 140° C.: it will therefore also be necessary to adapt the protocol depending on the support 2. For example, the protocol applies when the support 2 is a support, notably flexible, of polycarbonate or of polyethylene naphthalene.

Thermoforming of the support 2 was mentioned above. Thermoforming of the support 2 may be useful in applications where we wish to incorporate the electrically conducting track (for example an antenna) in electronic equipment (telephone, pager, etc.). Instead of printing the electrically conducting track 3 directly on a printed circuit, the idea is to miniaturize it and incorporate it in a specially dedicated module, for example on a support based on plastic. Thermoforming is a technique that consists of taking a material in plate form (in our case preferably a plastic), heating it to soften it, and taking advantage of this ductility to shape it with a mold. The material hardens again when it cools, keeping the desired shape for integration. In the case of plastic thermoforming, the material used is most often in the form of plastic film comprising the antenna, which is thermoformed on a plastic shell generally of ABS (acronym of acrylonitrile butadiene styrene) or PC (acronym of polycarbonate)/ABS or ABS/PC. Thermoforming is based on the phenomenon of glass transition of thermoplastics. In fact, above their glass transition temperature, thermoplastics are in the rubbery state, and it then becomes easy to give them a new shape. Once the temperature drops below the glass transition temperature, the polymer returns to the solid, i.e. vitreous, state. Thermoforming comprises the following steps: heating the material; shaping the material on a suitable mold (by vacuum, under pressure, etc.); cooling (the part remains in the mold); mold release and removal of the final part. One of the main advantages of thermoforming is the relative speed of launching production, compared to injection.

In the context of thermoforming of the support 2, in this case it is proposed to utilize the temperature applied to the support 2 on the one hand to soften the support 2 with a view to giving it a particular shape, and on the other hand preferably to melt the metallic material (again, if it was already melted in the treatment step E2-5 for evaporation of the solvent) which results in that after thermoforming, metal particles 4 are soldered again by metallic material 5 despite the stresses applied on the support 2 for shaping. In this sense, very good conductivity of the electrically conducting track is maintained even after thermoforming. For carrying out thermoforming, support 2 may be at least partly formed by a ductile material that is thermoformable in the region of 140° C., such as polycarbonate or polyethylene. Although the alloy Ag—Bi becomes liquid at this thermoforming temperature, this is not serious as it remains bound/trapped between the metal particles of silver and solders the whole again on cooling.

More generally, in the context of the method, when at least one part of the support 2 (or even the whole support 2) is capable of being thermoformed, after the step of formation E2 of the track 3 on the support 2, the method comprises a step of thermoforming E4 of said at least one part of the support 2. This step of thermoforming E4 may be implemented after the step of melting E2-4 described above, notably when it is implemented during the heat treatment step E2-5, or this step may be such that the step of melting E3 of the metallic material 5 is implemented for the first time. It will be understood from the foregoing that the metallic material 5 may undergo one or two meltings depending on circumstances, and in the context of thermoforming it may be the first melting or the second melting; in particular, evaporation of the solvent from the solution may not cause melting of the metallic material. The thermoforming step E4 may also be such that it does not allow melting of the metallic material 5, notably if the latter has already melted during the treatment step E2-5 and is capable of receiving the mechanical stresses associated with thermoforming without breaking the electrical connections between metal particles 4 produced by melting during step E2-5.

According to one embodiment, it is said that the thermoforming step E4 causes melting E3 of the metallic material 5 (i.e. the thermoforming step E4 causes implementation of the step of melting E3 of the metallic material 5), and after the thermoforming step E4 some or all of the metal particles 4 of the set of metal particles are soldered together by said metallic material 5 that have recovered solid form, the solders at the end of the thermoforming step may be such as described above. It will be understood here that the thermoforming step E4 comprises application of a thermoforming temperature selected on the one hand to allow deformation of the support 2 and, if applicable, on the other hand to allow melting of the metallic material 5. At the end of the thermoforming step, support 2 retains the shape to which it was constrained, and track 3 may take on this shape. According to this embodiment, two cases are distinguished: either the method comprises a single step of melting E3 of the metallic material 5 implemented by the thermoforming step E4, or the method comprises two steps of melting E2-4 and E3 of the metallic material 5, called the first melting step E2-4 and the second melting step E3 respectively, the first melting step E2-4 being carried out during the step of heat treatment E2-5 owing to the temperature applied for evaporating the solvent and the second melting step E3 being carried out during the thermoforming step owing to the temperature applied for thermoforming the support 2.

Figure 5:
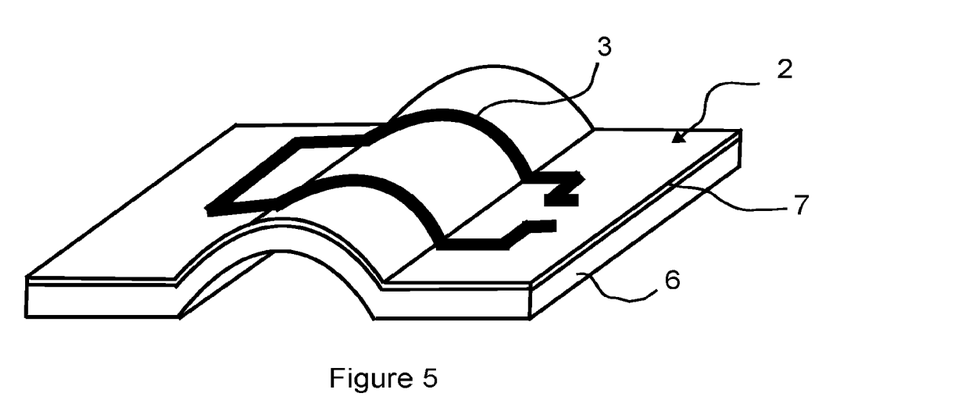
FIG. 5 illustrates the device in FIG. 1 after it has undergone thermoforming.

In the context of the device, the latter may be such that at least one part of the support 2 is formed by a material capable of being thermoformed, or else that the support 2 takes a shape obtained by thermoforming, said electrically conducting track 3 taking on said shape of the support 2 obtained by thermoforming (FIG. 5).

In the context of thermoforming, it will of course be understood that it is necessary to select a metallic material 5 whose melting may be obtained when the temperature for thermoforming the support 2 is applied. If the support is based on polycarbonate, its thermoforming temperature is 150° C., in this case the metallic material will be selected to be fusible at temperatures in the range from 90° C. to 170° C., when the metallic material has a melting point above the thermoforming temperature its use is still possible as the high temperatures (for example 170° C.) during thermoforming only last a few seconds, and PC may be used up to this temperature. This can guarantee high conductivity and good mechanical behavior of the electrically conducting track 3 during thermoforming. As mentioned above, it is not obligatory to go as far as melting of the metallic material 5, since it can receive the mechanical stresses and the latter had already been melted during step E2-5 through implementation of the associated melting step E2-4. However, to obtain low roughness and high final electrical conductivity of the electrically conducting track 3 deformed during thermoforming, it is preferable to go as far as melting of the metallic material: in fact, a good solder between the metallic material 5 and the metal particles 4 makes it possible to obtain good electrical contact and therefore a large contact surface.

Heating to produce melting (whether in step E2-5 and/or in the thermoforming step E4) may be performed by various methods: either by annealing on a heating plate, or by pulse-based annealing (Flash UV), or by microwave annealing, or by electrical annealing (joule activation).

More generally, melting of the metallic material 5 is such that it forms a soldered joint providing metal-to-metal connection between said solder and metal particles 4. The metallic material 5 is selected so that its melting avoids superheating of other elements of the device, to prevent degradation of these other elements. The amount of metallic material 5 may be selected so as to use a minimum of metallic material 5 to provide the metal-to-metal connections: the aim is not to embed the metal particles in a layer of metallic material. In this sense, the concentration of metal particles 4 relative to the metallic material 5 may depend on the mechanical stresses implemented in particular during thermoforming, and on the thermoforming temperature.

It will be understood that there are numerous advantages in using a mixture as described in the context of the method and said electrically conducting track 3 in the context of the device. For example, after annealing the solution, the metallic material 5 forms a fusible alloy that solders the metal particles 4 together, giving electrical conductivity close to that of a defect-free massive material. It is intended that the fusible phase of the metallic material 5 should partly preserve the mechanical and electrical characteristics during thermoforming of the electrically conducting track 3 having the capacity to deform plastically during heavy contacts and when the temperature rises, in order to allow soldering of the fusible phase at the surface of the metal particles 4 to obtain electrical continuity of the layer forming the electrically conducting track 3 after thermoforming. The use of metallic materials from soldering technology is certainly among the techniques for assembly of the metal particles 4 that ensure best electrical performance of the solution after annealing (evaporation of the solvent) and thermoforming. The metallic material 5 forms solder joints consisting of a metallurgical bond of the metals to be assembled, resulting from solidification of the solder, as its melting point is always below that of the silver particles present. This metallic material 5, also called supplied metal, which is for example based on indium (In), or based on alloys Sn—Pb, Au—Sn, etc., is brought to the liquid state (melting of the latter) by a heat source, penetrates by capillarity between the edges of the surfaces of the metal particles 4 by filling all the interstices, and preferably becomes embedded literally in the surface layer of the support 2. This metallic material serves for total wetting of the surfaces by the molten alloy, without which it is impossible to ensure true electrical continuity of the track 3. The capacity for soldering is intimately connected with the fact that the alloy wets the surfaces well, and is a very complex property.

In certain cases, notably in the case of formation of the electrically conducting track 3 on a thermoformable support 2, it may be advantageous to improve the adhesion of the electrically conducting track 3. Adhesion may notably be improved if the support comprises—or consists of—polycarbonate, $SiO_2$ or an oxide (the base material of the support will be selected depending on whether or not implementation of the thermoforming step is selected), by using a hanging layer. This hanging layer may be used whether or not we wish to carry out thermoforming subsequently if support 2 allows this: an adherent solution is always more useful than a solution that is not adherent. The hanging layer is nevertheless preferred when thermoforming of the support 2 is carried out to improve holding of the track on the support 2 during thermoforming. More generally, in the context of the method, the latter may comprise a step of formation E5 (FIG. 3) of the support 2 to be supplied, comprising a step of supply E5-1 of a base, notably of polycarbonate or of $SiO_2$ or of oxide, and a step of formation E5-2 of a hanging layer 7 intended to form an interface between the electrically conducting track 3 and the base 6 (FIGS. 1, 2, and 5). For this, the hanging layer 7 may comprise a thiol and a methoxy, the thiol group provides hanging with the metal particles 4, notably of silver (although the thiol group is also compatible with the other materials mentioned for forming the metal particles), and/or the metallic material 5, notably when it comprises silver or other metals as mentioned above, and the methoxy group provides hanging on the base notably of polycarbonate or of $SiO_2$ or of oxide. The hanging layer 7 may be formed of $HSCH_2(CH_2)_9CH_2OH$, of 4-mercapto-1-butanol, of 5-amino-1,3,4-thiadiazole-2-thiol, which offer the advantage of remaining stable at 140° C.; other hanging layer made of other materials may be used but risk being less effective. In the context of the device, it is said that the support 2 may comprise a base 6 and a hanging layer 7 arranged on the base 6 and ensuring holding of the electrically conducting track 3 on said support 2, and notably even during thermoforming of said support 2. In other words, the hanging layer 7 has affinity with the material of the base 6 of the support and those of the track 3 to ensure a good mechanical bond between the base 6 and the track 3. The hanging layer 7 may also comprise a carboxyl group or a group comprising $HSONH2$. In the context when we wish to produce a hanging layer without subsequent thermoforming of the support, $Al_2O_3$ may be used as the hanging layer 7.

The present invention is quite particularly suitable for forming an antenna or an inductance based on the electrically conducting track 3, whose essential parameter is the electrical conductivity, which must be as high as possible. In particular, the electrically conducting track may comprise an electrical conductivity between $10^5$ and $10^6$ $S \cdot m^{-1}$ even after thermoforming of the support. Notably, the antenna formed from the track may be a wire antenna, a slot antenna, a patch antenna, an open antenna, a reflector antenna, etc., the design of which may be adapted by a person skilled in the art.

Moreover, the use of a metallic material 5 that has melted to form, with the metal particles 4, the electrically conducting track 3 allows the latter to have low roughness, which offers an advantage, notably in the context of antennas. In fact, as electric conduction takes place on the skin of the deposit (surface current of the metal track), roughness becomes important for high frequencies: it is necessary for the surface to be flat for good efficiency between the electromagnetic wave and the current that are created in the metal track.

The metal particles 4 are notably such that they do not become molten during implementation of the method, thus keeping their original shape.

Everything that has been said in relation to the device may be applied to the method for fabricating the device, and everything that has been said in relation to the method may be applied to the device. Moreover, the method may be such that it allows simultaneous formation of a plurality of devices as described, which share one and the same support 2 before being separated.

Figure 6:
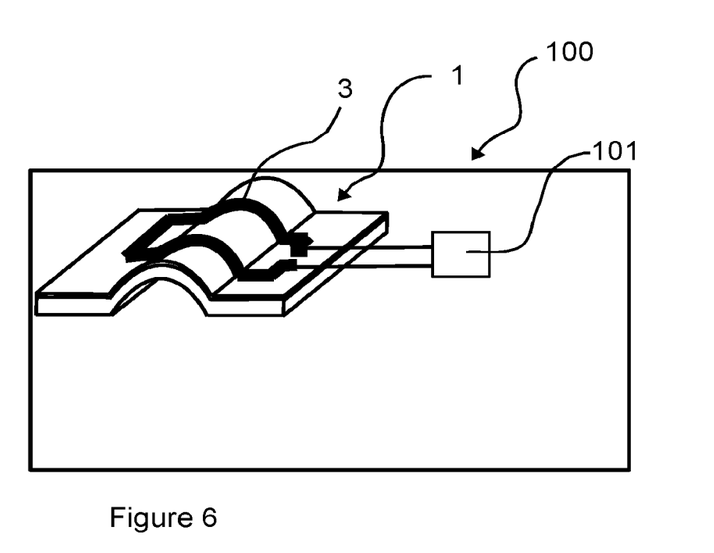
FIG. 6 illustrates an electronic object incorporating the device in FIG. 5.

It will be understood from the foregoing that it is possible to obtain antennas of different forms that can take on the shape of any type of surface, thus facilitating their integration. In other words, the invention also relates to an electronic object 100 (FIG. 6), notably for communication of the portable telephone type, comprising device 1 as described. In particular, the electrically conducting track 3 forms at least one part of an antenna connected to an emitting and/or receiving module 101 or forms at least one part of an inductance. Notably, the device 1 is shaped by thermoforming so as to take on the shape of a part of the electronic object, for example a shell, notably of plastic, for covering the latter.

In general, the deposited solution, and the resultant electrically conducting track, have dimensions and compositions that are suitable for the application (inductance or antenna). In particular, after deposition of the solution, the thickness of the deposited solution may be between 500 μm and 2 mm, for a width between 50 μm and 150 μm (and preferably equal to 100 μm). Once the track is made, i.e. notably after evaporation of the solvent, the track may have a thickness between 5 μm and 30 μm, for a width of the order of 100 μm. Moreover, the electrically conducting track may be such that the metal particles are joined together electrically by the metallic material. The electrically conducting track may comprise a stack of metal particles joined together electrically by soldering with metallic material 5.

The use of thermoforming is preferred in antenna applications; in inductance applications the substrate will preferably not be thermoformed.

The invention claimed is:

1. A method for fabricating a device comprising an electrically conducting track arranged on a support, said method comprising:
    supplying the support;
    forming the electrically conducting track on the support comprising:
    supplying a solution to be deposited on the support, depositing the solution by printing on the support,
    wherein the supplied solution comprises a mixture of a solvent, of a set of metal particles, and of a metallic material having a melting point below a melting point of the metal particles of the set of metal particles;
    melting the metallic material, wherein the melting the metallic material is performed without melting the metal particles which results in formation of a solder of the melted metallic material between the metal particles of the set of metal particles; and
    thermoforming at least one part of the support,
    wherein the melting the metallic material is performed simultaneously with evaporation of the solvent or simultaneously with the thermoforming of the at least one part of the support.

2. The method according to claim 1, wherein the forming the electrically conducting track on the support further comprises performing heat treatment of the solution deposited on the support which results in the evaporation of the solvent.

3. The method according to claim 2, wherein the performing the heat treatment comprises:
    a first phase in which the support and the solution deposited are subjected to a first temperature comprised between 40° C. and 80° C., for a first time comprised between 1 second and 360 seconds, then
    a second phase in which the support and the solution deposited are subjected to a second temperature comprised between 80° C. and 120° C., for a second time comprised between 1 second and 500 seconds, and then
    a third phase in which the support and the solution deposited are subjected to a third temperature comprised between 100° C. and 300° C., for a third time comprised between 1 second and 3600 seconds.

4. The method according to claim 2, wherein the performing the heat treatment results in melting of the metallic material.

5. The method according to claim 1, wherein the thermoforming causes the melting of the metallic material, and wherein, after the thermoforming, some or all of the metal particles of the set of metal particles are soldered together by said metallic material.

6. The method according to claim 1, wherein the depositing the solution on the support is such that a pattern is produced that delimits at least one part of an antenna or inductance.

7. The method according to claim 1, wherein the metallic material is selected from the following alloys: Ag-Bi, Ag-Sn-Bi, Ag-Sn-Cu, Au-Sn.

8. The method according to claim 1, further comprising forming the support to be supplied, the forming the support comprising supplying a base and forming a hanging layer as an interface between the electrically conducting track and the base.

9. The method according to claim 1, wherein the melting point of the metallic material is lower than or equal to a thermoforming temperature used to perform the thermoforming.

* * * * *